US012652977B2

(12) United States Patent
Shinoda et al.

(10) Patent No.: US 12,652,977 B2
(45) Date of Patent: Jun. 9, 2026

(54) ETCHING METHOD

(71) Applicant: Hitachi High-Tech Corporation, Tokyo (JP)

(72) Inventors: Kazunori Shinoda, Tokyo (JP); Hirotaka Hamamura, Tokyo (JP); Kenji Maeda, Tokyo (JP); Kenetsu Yokogawa, Tokyo (JP); Thi-Thuy-Nga Nguyen, Aichi (JP); Kenji Ishikawa, Aichi (JP); Masaru Hori, Aichi (JP)

(73) Assignee: Hitachi High-Tech Corporation, Tokyo (JP)

( * ) Notice: Subject to any disclaimer, the term of this patent is extended or adjusted under 35 U.S.C. 154(b) by 222 days.

(21) Appl. No.: 18/025,442

(22) PCT Filed: Feb. 1, 2022

(86) PCT No.: PCT/JP2022/003711
§ 371 (c)(1),
(2) Date: Mar. 9, 2023

(87) PCT Pub. No.: WO2023/148797
PCT Pub. Date: Aug. 10, 2023

(65) Prior Publication Data
US 2024/0297046 A1 Sep. 5, 2024

(51) Int. Cl.
*H10P 50/24* (2026.01)
*H10P 50/20* (2026.01)
*H10P 50/26* (2026.01)

(52) U.S. Cl.
CPC ............ *H10P 50/242* (2026.01); *H10P 50/20* (2026.01); *H10P 50/24* (2026.01); *H10P 50/264* (2026.01)

(58) Field of Classification Search
None
See application file for complete search history.

(56) References Cited

U.S. PATENT DOCUMENTS

| | | | |
|---|---|---|---|
| 2016/0265112 A1 | 9/2016 | Tolle et al. | |
| 2018/0218915 A1 | 8/2018 | Kim et al. | |
| 2019/0019670 A1* | 1/2019 | Lin | B08B 5/00 |
| 2020/0027741 A1* | 1/2020 | Kal | H01L 21/67109 |

(Continued)

FOREIGN PATENT DOCUMENTS

| | | |
|---|---|---|
| CN | 108122979 A | 6/2018 |
| JP | 2019-033249 A | 2/2019 |

(Continued)

OTHER PUBLICATIONS

Search Report mailed Apr. 12, 2022 in International Application No. PCT/JP2022/003711.

(Continued)

*Primary Examiner* — Stephanie P Duclair
(74) *Attorney, Agent, or Firm* — Miles & Stockbridge, P.C.

(57) ABSTRACT

An etching technology with high uniformity of the amount of etching and improved yields of etching treatment is provided. An etching method for etching a film layer to be treated including SiGe placed on a surface of a wafer, includes: a step of forming a reaction layer including nitrogen-hydrogen bond on a surface of the film layer by supplying reactive particles including fluorine, hydrogen, and nitrogen to the surface of the film layer; and a step of heating the film layer to desorb the reaction layer.

8 Claims, 8 Drawing Sheets

(56)     References Cited

U.S. PATENT DOCUMENTS

| 2020/0312981 A1* | 10/2020 | Bomberger | ............ H01L 29/34 |
| 2021/0313438 A1 | 10/2021 | Yeo et al. | |
| 2023/0124597 A1 | 4/2023 | Takahashi et al. | |
| 2023/0377994 A1 | 11/2023 | Savant et al. | |

FOREIGN PATENT DOCUMENTS

| JP | 2021-150488 A | 9/2021 |
| TW | 201700781 A | 1/2017 |
| TW | 201908027 A | 3/2019 |
| TW | 202113989 A | 4/2021 |
| TW | 202141621 A | 11/2021 |

OTHER PUBLICATIONS

Office Action mailed Jan. 17, 2024 in Taiwanese Application No. 112103289.

* cited by examiner

ETCHING METHOD

TECHNICAL FIELD

The present invention relates to a method of etching a film layer to be treated including a semiconductor, e.g., SiGe and Ge, using plasma.

BACKGROUND ART

Smaller semiconductor devices and higher degree of integration by three-dimensional structure are developed. In logic devices, at 14 nm node and beyond, the structure of Field Effect Transistor (FET) has changed from a two-dimensional planar type to a three-dimensional fin type. Currently, Gate-All-Around (GAA) FET is under development toward a further higher degree of integration. The GAA FET has a structure that a channel is completely enclosed by gates, and a vertically stacked structure of a plurality of thin-film shaped channels known as nanosheets, or alternatively of a plurality of thin-line shaped channels known as nanowires. Currently, Si is used as channel material. In a next generation of 5 nm technology node and beyond, a technique that uses germanium (Ge) with higher mobility than Silicon (Si) as channel material is deemed to be prospective.

In the GAA FET fabrication process using Si as channel material, initially, a Si layer used as channel material and a silicon-germanium (SiGe) layer used as a sacrificial layer are epitaxially grown in an alternating fashion to create a multilayer structure. Subsequently, the multilayer structure is anisotropically dry-etched, and then the SiGe layer as the sacrificial layer is isotropically etched selective to a Si channel layer. The etched region of the SiGe layer is then filled with inner spacers to form a source, a drain, and a gate electrode, thereby finishing a GAA FET with Si used as channel material.

On the other hand, in the case of using Ge as a new channel material which is potential in a next generation of 5 nm technology node and beyond, a multilayer structure and a fabrication process used are different from those in the case of using Si as channel material. In the GAA FET fabrication process using Ge as channel material, initially, a Ge layer used as channel material and a SiGe layer used as a sacrificial layer are epitaxially grown in an alternating fashion to create a multilayer structure. Subsequently, aniso-tropic dry-etching is performed on the multilayer structure, and then the SiGe layer as the sacrificial layer is isotropically etched selective to a Ge channel layer. The etched region of the SiGe layer is then filled with inner spacers to form a source, a drain, and a gate electrode, thereby finishing a GAA FET with Ge used as channel material.

As a technology to etch SiGe selective to Si, for example, a method using a liquid mixture of hydrogen fluoride (HF), hydrogen peroxide ($H_2O_2$), and acetic acid ($CH_3COOH$) is used. However, as a result of smaller and smaller process dimensions and a use of three-dimensional structure with a high aspect ratio, in the wet treatment, the issue of pattern collapse due to the surface tension of chemicals, and the like are becoming manifest. For example, where high aspect ratio pattern of silicon is used, it is reported that, as the pattern pitch is reduced, a limit value of the pattern pitch at which collapse begins due to the surface tension during the drying of rinse liquid is increased in proportion to the square of the aspect ratio. Therefore, there has been an intensified need to develop a process technique to perform isotropic etching on various films without chemicals. To address this, as a conventional technology to use plasma rather than chemicals for isotropic etching of SiGe with high uniformity, for example, Japanese Patent Application Laid-Open Publication No. 2021-150488 (PTL 1) and U.S. patent application publication No. 2018/0218915 (PTL 2) are proposed.

PTL 1 discloses a technology to etch SiGe selective to Si by repeating a cycle of: a first step in which a remote plasma containing fluorine and oxygen radicals is used to oxidize the SiGe surface; and then a second step in which the oxidized film is removed through a HF/$NH_3$ gas treatment ($NH_3$: ammonia) and a heating treatment.

PTL 2 discloses a technology to etch SiGe selective to Si by repeating a cycle of: a first step of subjecting the SiGe surface to a reduction treatment using a hydrogen-containing plasma; then a second step of subjecting the SiGe surface to an oxidation treatment using an oxygen-containing plasma; and then a third step of heating.

CITATION LIST

Patent Literature

PTL 1: Japanese Patent Application Laid-Open Publication No. 2021-150488

PTL 2: U.S. patent application publication No. 2018/0218915

SUMMARY OF INVENTION

Technical Problem

In the abovementioned conventional technologies, no consideration has been given to the following points, giving rise to problems in developing next-generation devices.

Specifically, although the conventional technologies disclose the technology to perform cycle etching to etch SiGe selective to Si with high uniformity, there was no consideration given to a technology to perform cycle etching to etch SiGe selective to Ge with high uniformity. This in turn raises an issue of the technologies that are not ready for the fabrication process for the GAA FET using Ge as channel material which is potential in a next generation of 5 nm technology node and beyond. In the conventional technologies, etching selective to Si is achieved by forming an oxide on the SiGe surface and removing this. The technologies take advantage of the properties that surface oxidation of SiGe more readily progresses with increasing a Ge content in a film, and that volatility of the Ge oxide is higher than the volatility of the Si oxide. However, if such conventional atomic layer etching of SiGe is applied in the fabrication of the GAA FETs using next-generation Ge as channel material, there is an issue that, when the SiGe sacrificial layer is etched, the Ge channel layer, which should not be etched to remain by minimizing the amount of etching, is so excessively etched that the Ge channel layer is removed unintentionally.

In this way, in the conventional technologies of atomic layer etching of SiGe using surface oxide as a reaction product, the amount of etching is increased with materials having a high Ge content. Therefore, it is deemed that the technologies are suitable for fabricating the GAA FETs using Si as channel materials currently under development, but the application thereof is limited in the device fabrication step of GAA FETs using Ge as channel material in a next future generation and onward.

It is an object of the present invention to provide a cycle etching technology to etch SiGe selective to Ge with high uniformity of the amount of etching.

These and other objects and novel features of the present invention will be apparent from a reading of the following description in the specification and a review of the associated drawings.

Solution to Problem

The following is a brief description of a summary of typical embodiments of the present invention.

An etching technology according to an aspect of the present invention is a method for etching a film layer to be treated including a layer of SiGe and a layer of Ge placed on a surface of a wafer. The method includes: a step of forming a reaction layer having nitrogen-hydrogen bond on a surface of the layer of SiGe by supplying reactive particles by using a plasma of a gas mixture including at least fluorine, hydrogen, and nitrogen to the surface of the layer of SiGe exposed to the plasma; and a step of heating the film layer to desorb the reaction layer.

Advantageous Effects of Invention

The following is a brief description of advantageous effects obtained by representative embodiments of the present invention.

With the etching technology according to the present invention, it is possible to etch SiGe selective to Ge and also to improve the uniformity of the amount etching. For example, in the step of fabricating the GAA FETs using Ge as channel material, for etching the SiGe sacrificial layer selective to the Ge channel layer, a technology of isotropic atomic layer etching may be provided with high uniformity of the amount of etching in the in-plane direction of a wafer and the depth direction of pattern.

DESCRIPTION OF EMBODIMENTS

Embodiments according to the present invention will be described below with reference to the accompanying drawings. It is understood that, in the following description, like reference signs indicate the same components or elements and a repeated description may be omitted in some cases. It is to be understood that, for the purpose of providing a clearer description, the figures may show schematically as compared to an actual aspect in some cases, but the figures are merely illustrative, and the present invention should not be construed as being limited to the figures.

In the step of fabricating semiconductor devices, e.g., Gate All Around type Field Effect Transistors (GAA FETs) using germanium (Ge) as channel material, it is considered to need a technology for isotropically etching a sacrificial layer of silicon germanium (SiGe) selective to a Ge channel layer with excellent uniformity. Therefore, the inventors have studied the case of performing the atomic layer etching by the conventional technologies on a structure as illustrated in FIG. 10, by way of example.

Figure 10:
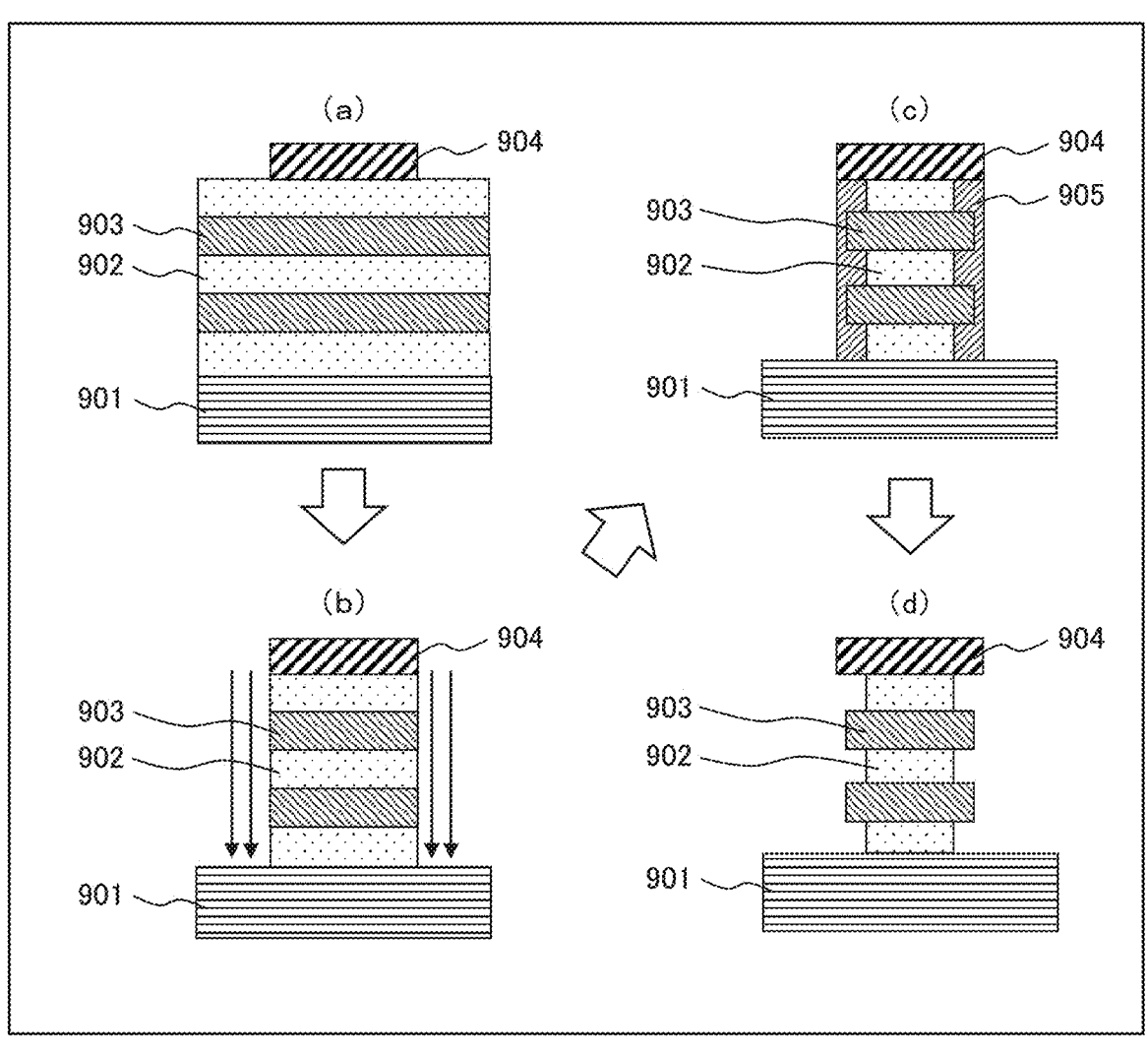
FIG. 10 illustrates schematically vertical cross-section views of changes of a multilayer film structure when the atomic layer etching in the conventional technologies is applied to the multilayer film structure formed on a sample on the substrate such as of a semiconductor wafer to be treated.

FIG. 10 illustrates schematically vertical cross-section views of changes of a predetermined multilayer film structure when the atomic layer etching by the conventional technologies is applied to the multilayer film structure that is formed by alternately stacking a Ge channel layer and a SiGe sacrificial layer on a sample on the substrate such as of a semiconductor wafer to be treated. FIG. 10(a) to (d) show the four-stage states of the shape of the film structure changed by being subjected to the etching treatment.

FIG. 10(a) is the view illustrating the film structure before the start of the etching treatment, in which Ge channel layers 902 and SiGe sacrificial layers 903 are alternately epitaxially grown on an underlying structure 901, and a mask 904 is formed to protect a portion to be untreated. FIG. 10(b) is the view illustrating the state where the multilayer structure composed of the Ge channel layers 902 and the SiGe sacrificial layers 903 in the film structure in FIG. 10(a) is subjected to reactive ion etching using a plasma generated from a gas mixture of chlorine and argon in order to anisotropically process a portion uncovered by the mask 904. FIG. 10(c) is the view illustrating the state where, as a first step of the atomic layer etching, an oxygen plasma is used to produce surface oxidation of the side faces of the Ge channel layers 902 and the SiGe sacrificial layers 903 to form a reaction layer 905 including mainly oxides. FIG. 10(d) is the view illustrating the state where, as a second step of the atomic layer etching, rapid heating is used to volatilize the reaction layer 905 including mainly oxides, on the surfaces of the Ge channel layers 902 and the SiGe sacrificial layers 903.

It has been confirmed in the studies conducted by the inventors that, for the stacked structure of the Ge channel layers 902 and the SiGe sacrificial layers 903 as illustrated in FIG. 10(d), in an attempt to etch uniformly only the SiGe sacrificial layer 903, the Ge channel layer 902 should not be etched to remain, but the Ge channel layer 902 as well as the SiGe sacrificial layer 903 were etched due to no use of a process having selectivity to Ge. Also, a preferable amount of etching of the Ge channel layer 902 is small, but the amount of etching of the Ge channel layer 902 was greater than that of the SiGe sacrificial layer 903. A first cause of the phenomenon occurring is, initially as illustrated in FIG. 10(c), that the thickness of the reaction layer 905 including mainly oxides generated by the oxygen plasma becomes greater at the Ge channel layer 902 with large Ge composition, but smaller at the SiGe sacrificial layer 903 with small Ge composition. This results from Ge more easily undergoing oxidation than Si. Also, a second cause is that, on the ground of a higher volatility of the Ge oxide than the volatility of the Si oxide, the reaction layer 905 including mainly the oxides generated on the Ge channel layer 902 with large Ge composition readily volatilizes in the heating step. As a result, in the etching of the SiGe sacrificial layer 903 with the conventional technologies, the Ge channel layer 902 of which the amount of etching should be reduced is greatly etched concurrently with the SiGe sacrificial layer 903 etched. This could result in a significant reduction in yields of the manufacturing of the semiconductor devices.

In this way, in the conventional atomic layer etching technology using plasma, it is impossible that the Ge channel layer 902 is not etched to remain when the SiGe sacrificial layer 903 is etched. Therefore, in the conventional technology of the atomic layer etching of SiGe selective to Si, the application thereof is deemed to be limited in the fabrication step of next and future generation devices requiring the application of Ge as the channel material.

The inventors have attempted the atomic layer etching of SiGe and Ge using various gas plasmas. As a result, the following items (1) to (6) were found.

(1) The wafer temperature is set in a range from −40° C. or higher to less than 50° C., and an active species generated from the plasma of a gas mixture containing at least fluorine, hydrogen, and nitrogen is supplied to the surfaces of the SiGe film and the Ge film in order to form, on the surfaces, a surface reaction layer including mainly ammonium salt characterized by containing a nitrogen-hydrogen (N—H) bond.

(2) Adding oxygen to the gas mixture increases the efficiency of generating the ammonium salt characterized by containing the nitrogen-hydrogen (N—H) bond.

(3) The formation rate of the surface reaction layer decreases with increasing the Ge content.

(4) The formation rate of the surface reaction layer has self-saturation (self-limiting nature) in terms of the plasma exposure time.

(5) The surface reaction layer is removed by heating at 50° C. or above.

(6) The removal rate of the surface reaction layer has self-saturation (self-limiting nature) in terms of the heating time.

The present invention has evolved based on the new findings (1) to (6).

A method of atomic layer etching of SiGe includes performing, specifically, the following two of step 1 and step 2.

(Step 1) The step is performed to generate a plasma from a gas mixture of at least: a gas containing fluorine such as tetrafluoromethane ($CF_4$), trifluoromethane ($CHF_3$), nitrogen trifluoride ($NF_3$), and sulfur hexafluoride ($SF_6$); a gas containing hydrogen such as hydrogen ($H_2$), difluoromethane (methylene fluoride, $CH_2F_2$), fluoromethane ($CH_3F$), and methane ($CH_4$); and a gas containing nitrogen such as nitrogen ($N_2$), nitric oxide (NO), ammonia ($NH_3$), and $NF_3$. Then, reactive particles including fluorine, hydrogen, and nitrogen are provided from the plasma onto the surface of SiGe film to be subjected to the etching treatment. And, a surface reaction layer including mainly ammonium salt characterized by containing the N—H bond is formed on the surface of the SiGe film.

(Step 2) The step is performed subsequent to step 1 to heat and remove the surface reaction layer at 50° C. or above (or the step of heating the surface reaction layer for desorption).

And, a sequence of the two steps 1, 2 is regarded as a single cycle, and the cycle is repeated two or more times in order to accomplish the etching of the SiGe film in a desired amount (a film thickness).

With the above configuration, since the step of forming the surface reaction layer (step 1) and the step of removing the surface reaction layer (step 2) have self-saturation, the uniformity of the amount of etching increases in the in-plane direction of the wafer and the depth direction of pattern on the film structure such as a groove and a hole. Also, the amount of SiGe film removed through one cycle can be adjusted with high accuracy, so that the amount of etching obtained through the repeated cycles can be adjusted by the number of repeated cycles. This may lead to improved dimension precision of the semiconductor devices formed by etching the stacked SiGe films.

Figure 9:
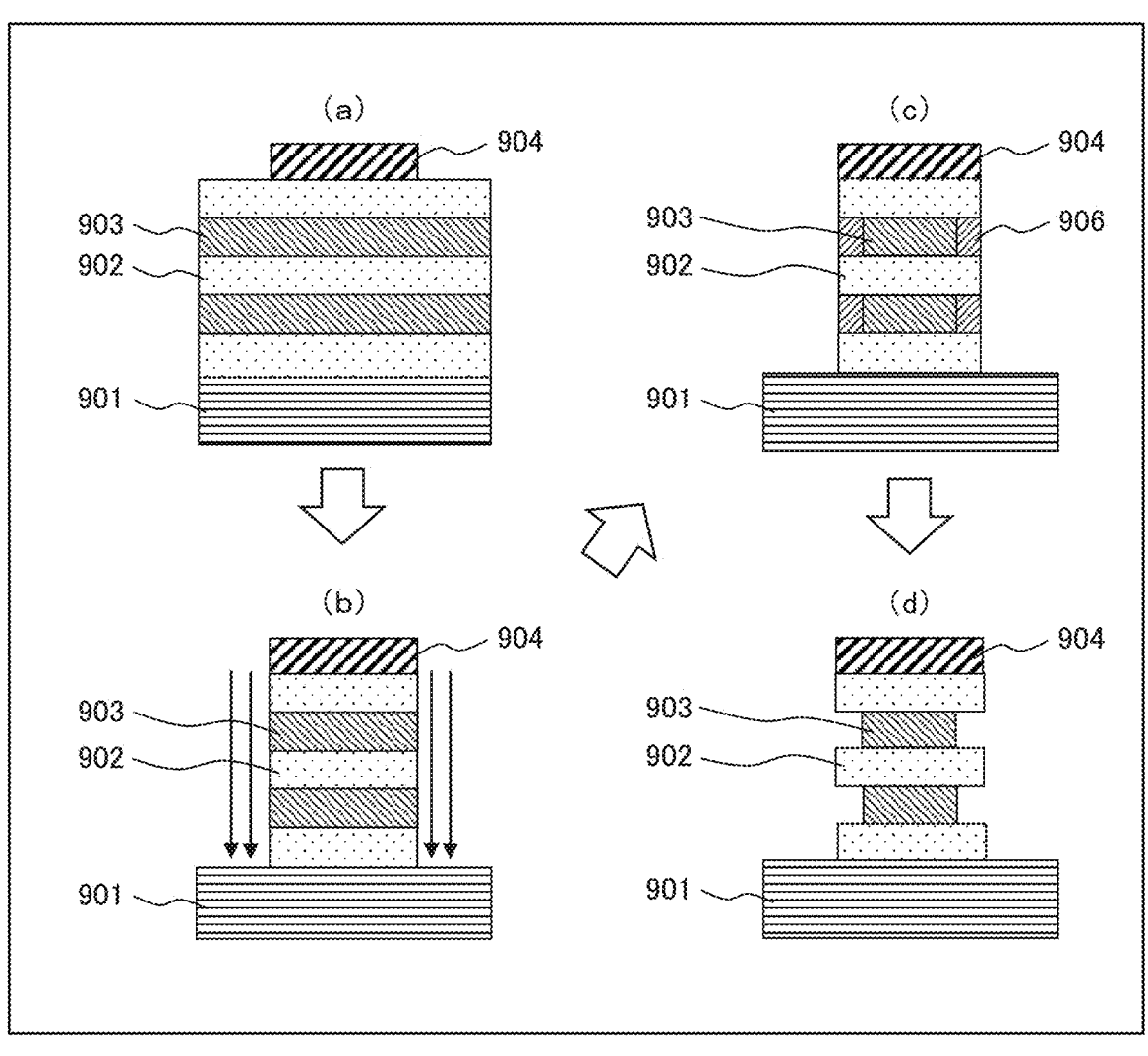
FIG. 9 illustrates schematically vertical cross-section views of changes of a multilayer film structure when the atomic layer etching in the technology according to the present invention is applied to the multilayer film structure formed on a sample on the substrate such as of a semiconductor wafer to be treated.

FIG. 9 illustrates schematically vertical cross-section views of changes of a predetermined multilayer film structure when the atomic layer etching by the technology according to the present invention is applied to the predetermined multilayer film structure formed by stacking alternately the Ge channel layers and the SiGe sacrificial layers which are formed on a sample on a substrate, such as of a semiconductor wafer to be treated. FIG. 9(a) to (d) show the four-stage states of the shape of the film structure changed by being subjected to the etching treatment.

FIG. 9(a) is the view illustrating the film structure before the start of the etching treatment, in which the Ge channel layers 902 and the SiGe sacrificial layers 903 are alternately epitaxially grown on the underlying structure 901, and the mask 904 is formed to protect a portion to be untreated. FIG. 9(b) is the view illustrating the state where the multilayer structure including the Ge channel layers 902 and the SiGe sacrificial layers 903 in the film structure in FIG. 9(a) is subjected to reactive ion etching using plasma generated from a gas mixture of chlorine and argon in order to anisotropically process a portion uncovered by the mask 904. FIG. 9(c) is the view illustrating the state where, as a first step of the atomic layer etching, a plasma of a gas mixture containing fluorine, hydrogen, and nitrogen is used to treat the surface of the side faces of the Ge channel layers 902 and the SiGe sacrificial layers 903 to form a reaction layer 906 mainly on the surface of the SiGe layer, the reaction layer 906 including mainly ammonium salt containing a nitrogen-hydrogen bond (N—H bond). At this time, an unshown reaction layer including mainly ammonium salt containing a minimal N—H bond is also generated on the surface of the Ge channel layer 902. FIG. 9(d) is the view illustrating the state where, as a second step of the atomic layer etching, heating is used to volatilize the reaction layer 906 generated on the surface of the Ge channel layers 902 and the SiGe sacrificial layers 903, the reaction layer 906 containing mainly of the ammonium salt containing the N—H bond.

It has been confirmed in the studies conducted by the inventors that, for the stacked structure of the Ge channel layers 902 and the SiGe sacrificial layers 903 as illustrated in FIG. 9(*d*), by etching the SiGe sacrificial layers 903 using a procedure according to the present invention, the SiGe sacrificial layers 903 were etched selective to the Ge channel layers 902. A first cause of the phenomenon occurring is that, initially as illustrated in FIG. 9(*c*), the thickness of the reaction layer 906 including mainly ammonium salt generated by the plasma of a gas mixture containing fluorine, hydrogen, and nitrogen becomes greater at the SiGe sacrificial layer 903 with small Ge composition, but significantly smaller at the Ge channel layer 902 with large Ge composition (not shown). This results from a newly found phenomenon where a film containing a higher proportion of Si more easily generates the reaction layer including mainly the ammonium salt with N—H bond. Also, a second cause is that, on the ground of a higher volatility of ammonium salt including Ge than the volatility of ammonium salt including Si, the reaction layer 906, which consists mainly of the ammonium salt developed on the SiGe sacrificial layer 903 with larger Si composition, readily volatilizes in the heating step. As a result, in the etching of the SiGe sacrificial layer 903 by the technology according to the present invention, when the SiGe sacrificial layer 903 is etched, the amount of etching of the Ge channel layer 902 which should not be reduced is small. Thus, as compared to the conventional technologies, the manufacturing yield of the semiconductor devices is greatly improved. For more detailed description of the FIG. 9(*a*) to (*d*), a description of FIG. 4(*a*) to (*c*) will be referred to later.

It is noted that, in the following examples, the etching treatment is performed by repeating a sequence of steps each of which includes a step of forming a surface reaction layer with self-saturation (step 1) and a step of removing the surface reaction layer (step 2), and the etching treatment is referred to as atomic layer etching. In the examples, the "atomic layer" etching is not limited to atomic layer etching narrowly defined as the etching rate per cycle equivalent to the thickness of a layer composed of single atoms of a substance forming a film of interest. Even if the etching rate per cycle is of the order of nanometers or larger, a treatment in each step having a tendency toward self-saturation, i.e., self-limiting, in terms of treatment time and/or the like is referred to as atomic layer etching. It is noted that designations of "digital etching", "cycle etching of self-limiting nature", "atom-level etching", "layer-by-layer etching", and the like may be used for equivalent treatments.

Examples of the present invention will be described below with reference to the accompanying drawings.

EXAMPLE

An example of the present invention will now be described with reference to FIG. 1 to FIG. 8. In the description in the example, after a step is performed to form a surface reaction layer on the surface of a to-be-treated SiGe film by a plasma formed using a gas mixture containing trifluoromethane ($CHF_3$), oxygen ($O_2$) and nitrogen ($N_2$), a step is performed to remove the surface reaction layer by wafer heating using an infrared lamp, thereby isotropically performing atomic layer etching on the to-be-treated SiGe film pre-formed on the semiconductor wafer such as of silicon.

Figure 1:
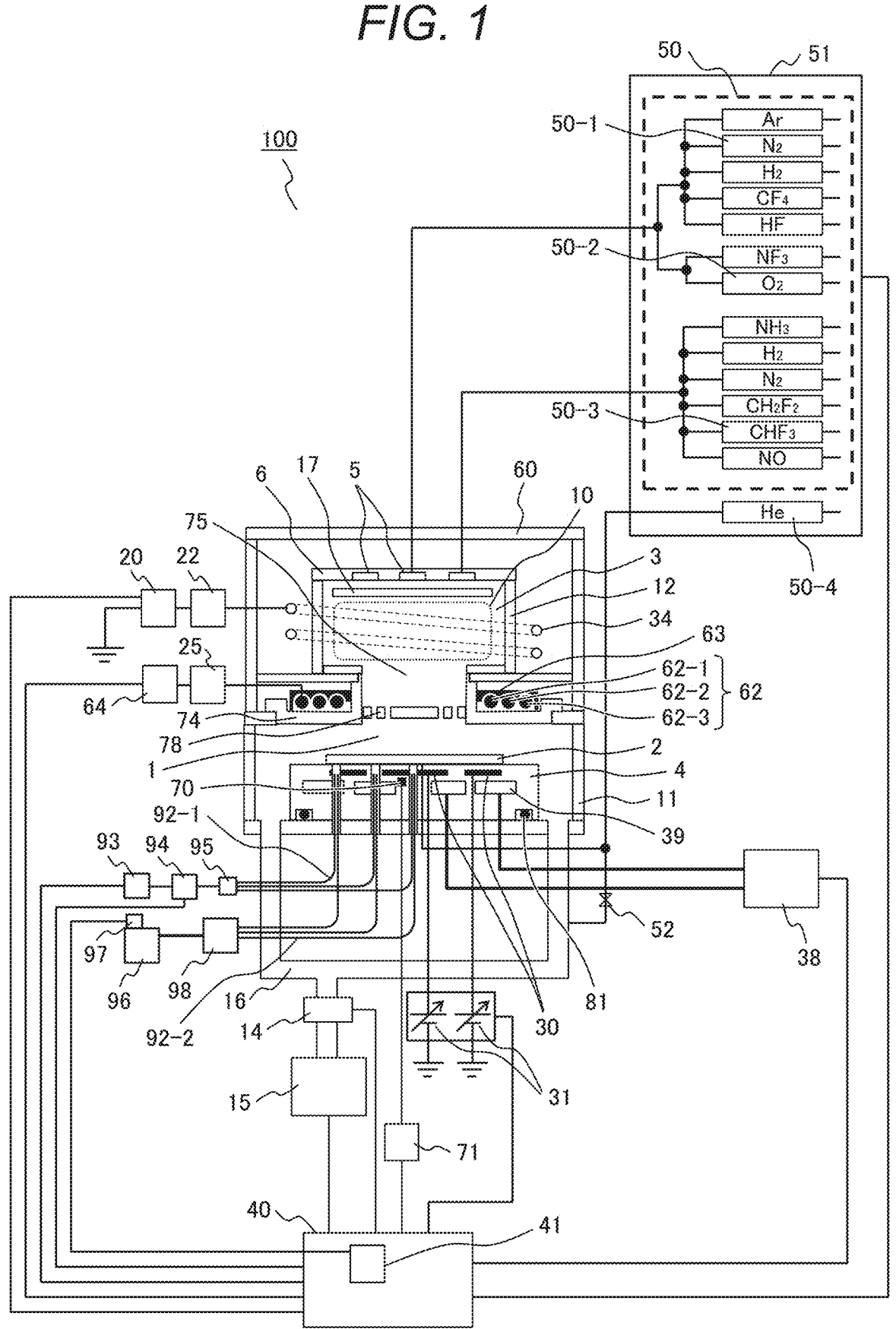
FIG. 1 is a schematically vertical cross-section view illustrating the overview of the configuration of a plasma treatment apparatus according to an example of the present invention.

FIG. 1 is a schematically vertical cross-section view illustrating the overview of the configuration of a plasma treatment apparatus according to an example of the present invention.

A treatment chamber 1 of a plasma treatment apparatus 100 includes a base chamber 11 in which a wafer stage 4 (hereinafter referred to as a "stage 4") is installed to load a wafer 2 as a treated sample (hereinafter referred to as a "wafer 2"). An inductively coupled plasma (ICP) technique is used for a plasma source. The plasma source including a quartz chamber 12, an ICP coil 34, and a high-frequency power supply 20 is installed above the treatment chamber 1. Here, the ICP coil 34 is installed on the outside of the quartz chamber 12.

The high-frequency power supply 20 for plasma generation is connected through a matching box 22 to the ICP coil 34. It is assumed that a frequency band of several tens MHz such as 13.56 MHz is used for the frequency of the high-frequency power. A top panel 6 is placed on the upper portion of the quartz chamber 12. A shower plate 5 is installed in the top panel 6, and in a lower portion thereof, a gas dispersion plate 17 is installed. Treatment gas is introduced into the treatment chamber 1 from the outer periphery of the gas dispersion plate 17.

The flow rate of the treatment gas to be supplied is adjusted by a mass flow controller 50 that is installed for each gas species within a mass flow controller control section 51. In FIG. 1, at least trifluoromethane ($CHF_3$), oxygen ($O_2$), and nitrogen ($N_2$) are supplied as treatment gas into the treatment chamber 1, and mass flow controllers 50-1, 50-2, 50-3 are equipped corresponding to the respective gases ($N_2$, $O_2$, $CHF_3$). Also, the supplied gases are not limited to the above. It is noted that the mass flow controller control section 51 includes a mass flow controller 50-4 installed to adjust the flow rate of helium (He) gas supplied into between the underside of the wafer 2 and the top side of a dielectric film of the stage 4 loaded with the wafer 2, as described later.

A lower portion of the treatment chamber 1 is connected to an evacuation unit 15 via vacuum evacuation piping 16 for the purpose of a pressure reduction in the treatment chamber 1. The evacuation unit 15 is composed of, for example, a turbo-molecular pump, a mechanical booster pump and/or a dry pump. Also, a pressure adjustment unit 14 is installed upstream of the evacuation unit 15. In order to adjust the pressure in the treatment chamber 1 and a discharge region 3 by increasing or decreasing the passage cross-sectional area as a cross-sectional area of a vertical plane in the axial direction of the vacuum evacuation piping 16 for adjustment to the flow rate of particles of the plasma 10 and the gas to be exhausted from the inside of the treatment chamber 1 by operation of the evacuation unit 15, the pressure adjustment unit 14 is configured to include a plurality of plate-shaped flaps and/or a plate member, the plate-shaped flaps placed with their shafts extending in the direction across the flow passage to rotate about the shafts, the plate member moving across the axial direction within the flow passage.

An infrared lamp unit is installed for heating the wafer 2 between the stage 4 and the quartz chamber 12 partially forming the ICP plasma source. The infrared lamp unit includes mainly the infrared lamp 62, a reflector 63 that reflects infrared light, and a light transmission window 74. A circular shaped (ring shaped) lamp is used for the infrared lamp 62. It is assumed that light radiation from the infrared lamp 62 means emission of light mainly containing from visible-light to light in the infrared light region. Such light as used herein is referred to as "infrared light". In the configuration illustrated in FIG. 1, three ring infrared lamps 62-1, 62-2, 62-3 are installed as the infrared lamp 62, but the infrared lamp 62 may be two ring infrared lamps, four ring infrared lamps, or the like. A reflector 63 is installed above the infrared lamp 62 for reflecting the infrared light downward.

The infrared lamp 62 is connected to an infrared lamp power supply 64, and a high frequency cutoff filter 25 is installed between the infrared lamp 62 and the infrared lamp power supply 64 for preventing noise of the high frequency power for plasma generation by the high-frequency power supply 20 from flowing into the infrared lamp power supply 64. The infrared lamp power supply 64 includes the capability of controlling the power supplied to the infrared lamps 62-1, 62-2, 62-3 independently of one another, so that the radial distribution of the amount of heating the wafer 2 is adjusted.

A gas passage 75 is formed at the center of the infrared lamp unit in order for the gas supplied from the mass flow controller 50 into the quartz chamber 12 to flow toward the treatment chamber 1. And, in the gas passage 75, a slit plate (ion shield) 78 with a plurality of apertures formed therein is installed to block ions and/or electrons produced in the plasma generated within the quartz chamber 12 in order to allow only neutral gas and/or neutral radical to pass through the slit plate to illuminate the wafer 2.

A coolant passage 39 is formed in the stage 4 to cool the stage 4. The coolant is supplied to be circulated through the stage 4 by a chiller 38. Further, electrostatic adsorption is used to fix the wafer 2 to the stage 4. For this purpose, electrostatic adsorption electrodes 30 which are plate-shaped electrode plates are embedded in the stage 4 and are connected respectively to electrostatic adsorption DC (Direct Current) power supplies 31.

Further, for efficiently cooling the wafer 2, He gas is supplied into between the stage 4 and the underside of the wafer 2 loaded on the stage 4. The stage 4 also has a wafer load side coated with a resin such as polyimide in order to protect the underside of the wafer 2 from damage even if the electrostatic adsorption electrodes 30 are actuated to heat or cool the wafer 2 that is being electrostatically adsorbed. Also, within the stage 4, a thermocouple 70 is installed to measure the temperature of the stage 4, and is connected to a thermocouple thermometer 71.

Further, optical fibers 92-1, 92-2 for measuring the temperature of the wafer 2 are installed in three locations which are: in the vicinity of the center of the wafer 2 loaded on the stage 4 (referred to also as "wafer center"); in the vicinity of a middle in the radius direction of the wafer 2 (referred to also as "wafer middle"); and in the vicinity of the perimeter of the wafer 2 (referred to also as "wafer perimeter"). The optical fiber 92-1 guides the infrared light from an external infrared light source 93 to the underside of the wafer 2 to irradiate the underside of the wafer 2 with the infrared light. On the other hand, of the infrared light emitted from the optical fiber 92-1, IR light passes through and is reflected from the wafer 2, and the optical fiber 92-2 collects and transmits the IR light in question to a spectroscope 96.

External infrared light generated by the external infrared light source 93 is transmitted to a light path switch 94 for turning on/off the light path. After that, an optical splitter 95 splits the external infrared light into a plurality of divisions (into three in the case of FIG. 1) which are then illuminated respectively to positions on the underside of the wafer 2 through three-system optical fibers 92-1.

The infrared light absorbed and reflected by the wafer 2 is transmitted to the spectroscope 96 through the optical fibers 92-2, so that data about wavelength dependence of the spectral intensity is obtained by a detector 97. The obtained data about wavelength dependence of the spectral intensity is sent to a computing section 41 of a control section 40 to calculate an absorption wavelength. Then, a temperature of the wafer 2 may be determined based on the calculated absorption wavelength. Also, an optical multiplexer 98 is installed at some midpoint of the optical fibers 92-2, so that for light to be spectroscopically measured, which light at a measurement point of the wafer center, the wafer middle, and the wafer perimeter is selected for performing the spectroscopic measurement. Thereby, the temperature at each of the wafer center, the wafer middle and the wafer perimeter may be determined in the computing section 41.

In FIG. 1, reference sign 60 indicates a container covering the quartz chamber 12, and reference sign 81 indicates an O ring used to create vacuum-seal between the stage 4 and the bottom of the base chamber 11.

The control section 40 controls ON/OFF of the high frequency power supplied from the high-frequency power supply 20 to the ICP coil 34. The control section 40 also controls the integrated mass flow controller control section 51 to adjust a gas species and a flow rate of the gas to be supplied from each mass flow controller 50 into the quartz chamber 12. In this state, the control section 40 further actuates the evacuation unit 15 and also controls the pressure adjustment unit 14 to adjust the pressure within the treatment chamber 1 to a desired pressure.

The control section 40 further actuates the electrostatic adsorption DC power supply 31 to cause the wafer 2 to be electrostatically adsorbed onto the stage 4, and actuates the mass flow controller 50-4 to supply the He gas into between the wafer 2 and the stage 4. In this condition, the control section 40 controls the infrared lamp power supply 64 and the chiller 38 such that the temperature of the wafer 2 is set to fall into a predetermined temperature range based on an internal temperature of the stage 4 measured by the thermocouple thermometer 71 and the temperature distribution information of the wafer 2, the temperature distribution information obtained by the computing section 41 based on the spectral intensity information in the vicinity of the center of the wafer 2, the vicinity of the middle in the radial direction of the wafer 2, and the vicinity of the perimeter of the wafer 2 which are measured by the detector 97.

Figure 2:
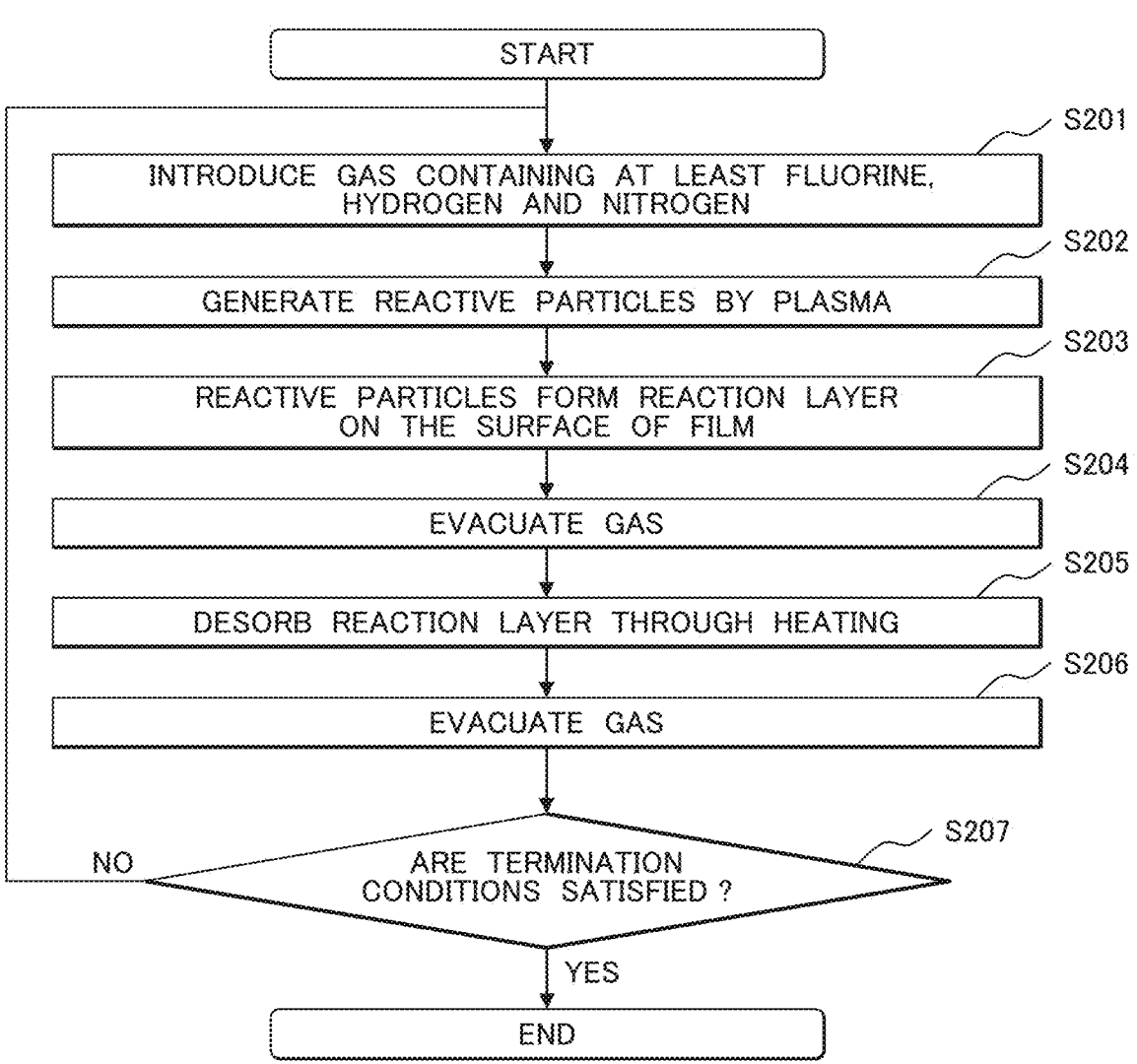
FIG. 2 is a flowchart illustrating the overview of the flow of etching treatment of a SiGe containing film pre-formed on a wafer performed by the plasma treatment apparatus according to an example of the present invention.

The flow of treatment performed on the wafer 2 in the plasma treatment apparatus 100 according to the example will be described with reference to FIG. 2. FIG. 2 shows a flowchart illustrating the overview of the flow of etching treatment of a SiGe containing film pre-formed on the wafer, the etching treatment performed by the plasma treatment apparatus 100 according to an example of the present invention.

In FIG. 2, prior to starting the treatment of the wafer 2, the wafer 2 having the surface preinstalled thereon with a film structure including a film layer to be treated including a SiGe film is loaded on the stage 4 in the treatment chamber 1. And the wafer 2 is held on the stage 4 by an electrostatic force developed by supplying DC power from the DC power supply 31 to the electrostatic adsorption electrode 30.

After the treatment is started, at step S201, a gas containing at least fluorine, hydrogen, and nitrogen is introduced into the treatment chamber 1. In this stage, as a gas containing fluorine, hydrogen, and nitrogen, other than the gas mixture of trifluoromethane ($CHF_3$)/oxygen ($O_2$)/nitrogen ($N_2$) described in the example, various gas mixtures may be utilized such as, e.g., tetrafluoromethane ($CF_4$)/hydrogen ($H_2$)/nitric oxide (NO), tetrafluoromethane ($CF_4$)/ammonia ($NH_3$), nitrogen trifluoride ($NF_3$)/hydrogen ($H_2$), and difluoromethane ($CH_2F_2$)/oxygen ($O_2$)/nitrogen ($N_2$). A mixture gas resulting from diluting any of the gases with argon (Ar), nitrogen ($N_2$), and/or the like may also be utilized. Also, the wafer temperature in the step S201 is maintained constant by the temperature adjustment function of the stage 4 loaded with the wafer 2. It is noted that, in some cases where oxygen is mixed at this stage, mixing oxygen produces: the effect of releasing fluorine accelerating a reaction because trifluoromethane is oxidized by oxygen; and the effect of increasing the generation efficiency of a reaction layer including mainly ammonium salt characterized by containing N—H bond because $H_2O$ generated by bonding oxygen and hydrogen together promotes the formation of the ammonium salt.

Subsequently, at step S202, the above gas is used within the discharge region 3 to generate a plasma 10, so that atoms or molecules of the gas containing fluorine, hydrogen, and nitrogen in the plasma 10 are activated to generate reactive particles (referred to also as an "active species") such as of fluorocarbon radical ($CF_x$) and hydrogen fluoride (HF). Further, at step S203, the reactive particles are provided to the surface of the wafer 2 through the gas passage 75 and through-holes of the slit plate 78 to adhere to the surface of the film layer including the SiGe film. The reactive particles react with the surface materials of the film layer to which the reactive particles adhere to form a surface reaction layer having a thickness determined according to the conditions of generation of the plasma 10 and/or the conditions of treatment such as a temperature of the stage 4. The temperature of the wafer stage 4 when the plasma is applied is preferably less than 50° C. A preferable temperature range is from −40° C. to 50° C. This is because if the temperature of the wafer 2 at this time becomes 50° C. or higher, progress of the desorption of the reaction product causes progress of etching during the plasma exposure, and in turn this leads to a reduction in self-limiting nature to the reaction. The surface reaction layer generated on the SiGe film or Ge film at this time has a major feature of including nitrogen-hydrogen (N—H) bond. The surface reaction layer has at least N—H bond, and ammonium salt such as ($NH_4$) $_xSiF_y$, and ($NH_4$) $_xGeF_y$ is included as a constituent.

After that, at step S204, the control section 40 confirms the formation of the surface reaction layer with a predetermined thickness by a film-thickness detector (not shown), checking if a predetermined amount of time has been elapsed, and/or the like. Then, the pressure adjustment unit 14 increases the passage cross-sectional area of the vacuum evacuation piping 16 to increase the evacuation rate, in order to achieve a substantial reduction in pressure within the treatment chamber 1. Thus, the gas containing fluorine, hydrogen, and nitrogen supplied into the treatment chamber 1 is rapidly evacuated. Thereby, the formation treatment for the surface reaction layer is terminated. In this connection, inert gases such as Ar may be supplied into the treatment chamber 1 in such a manner as to substitute for the gas containing fluorine, hydrogen, and nitrogen in the treatment chamber 1, thereby promoting the removal of the gas containing fluorine, hydrogen, and nitrogen.

Subsequently, at step S205, the infrared lamp 62 is turned on, so that the surface of the wafer 2 is heated in a vacuum by light (infrared light) emitted from the infrared lamp 62. The temperature at which the wafer 2 is heated by the infrared light at this time is preferably 50° C. or higher, and a preferable temperature range is from 50° C. to 300° C. The pressure in the treatment chamber 1 during the vacuum heating is preferably 100 Pa or less. The temperature of the wafer 2 rises at, e.g., a speed of about 10° C./sec along with an increase in illumination time of the infrared lamp. In turn, the temperature rise causes the surface reaction layer to volatilize from the surface to be removed (be desorbed) from the surface of the film layer. The infrared lamp 62 is turned off after it is confirmed by the temperature detection mechanism (92 to 97, 41) that the temperature of the wafer 2 rises to a predetermined temperature or alternatively it is confirmed by the control section 40 that a predetermined amount of time is elapsed.

Examples of volatile reaction products include, silicon tetrafluoride ($SiF_4$), germanium tetrafluoride ($GeF_4$), ammonia ($NH_3$), hydrogen fluoride (HF), and the like, which are caused, for example, by the decomposition of the ammonium salt. The particles of the reaction products desorbed from the wafer 2 are removed from the interior of the treatment chamber 1 to the outside of the treatment chamber 1 by the operation of the evacuation within the treatment chamber 1 through the operation of the pressure adjustment unit 14 or the evacuation unit 15, or alternatively by the flow of particle movement caused within the treatment chamber 1 by the above operation. Subsequently, at step S206, the gas including the reaction products is evacuated from the interior of the treatment chamber 1 to the outside of the treatment chamber 1.

A cycle as a sequence of the above steps S201 to S206 is terminated. In the cycle, the surface reaction layer developed on the surface of the SiGe film by the reaction with the plasma is removed (desorbed). Therefore, a thickness of the SiGe film corresponding to the film layer thickness of the surface reaction layer is removed to reduce the film thickness of the SiGe film. In the case of a Ge film, the formation rate is smaller than that of the SiGe film, but a surface reaction layer containing N—H bond is generated. Thus, Ge etching slightly progresses. Therefore, where the film structure has a multilayer structure of SiGe and Ge, SiGe etching selectively progresses, and the amount of Ge etching is small. The amount of SiGe etching and the amount of Ge etching are a selective ratio. Also, the amount of change in SiGe film thickness at this time corresponds to the etching rate per cycle.

After that, the control section 40 receives the output from a film-thickness detector which is not shown, and it is determined from the result obtained from the received output whether or not the termination conditions are satisfied, including a determination whether or not either a desired amount of etching is reached or the number of times the above-described cycle is performed through which the achievement of a desired amount of etching is derived from previously conducted tests and/or the like (S207). If it is determined that the conditions are satisfied (S207 Yes), the etching treatment of the film layer including the SiGe film is terminated. If it is determined that the conditions are not satisfied (S207 No), the flow goes back to step S201 to perform the cycle (S201 to S206) again. In this way, in the example, the above-described cycle (S201 to S206) is repeatedly performed until a desired amount of etching is obtained.

Figure 3:
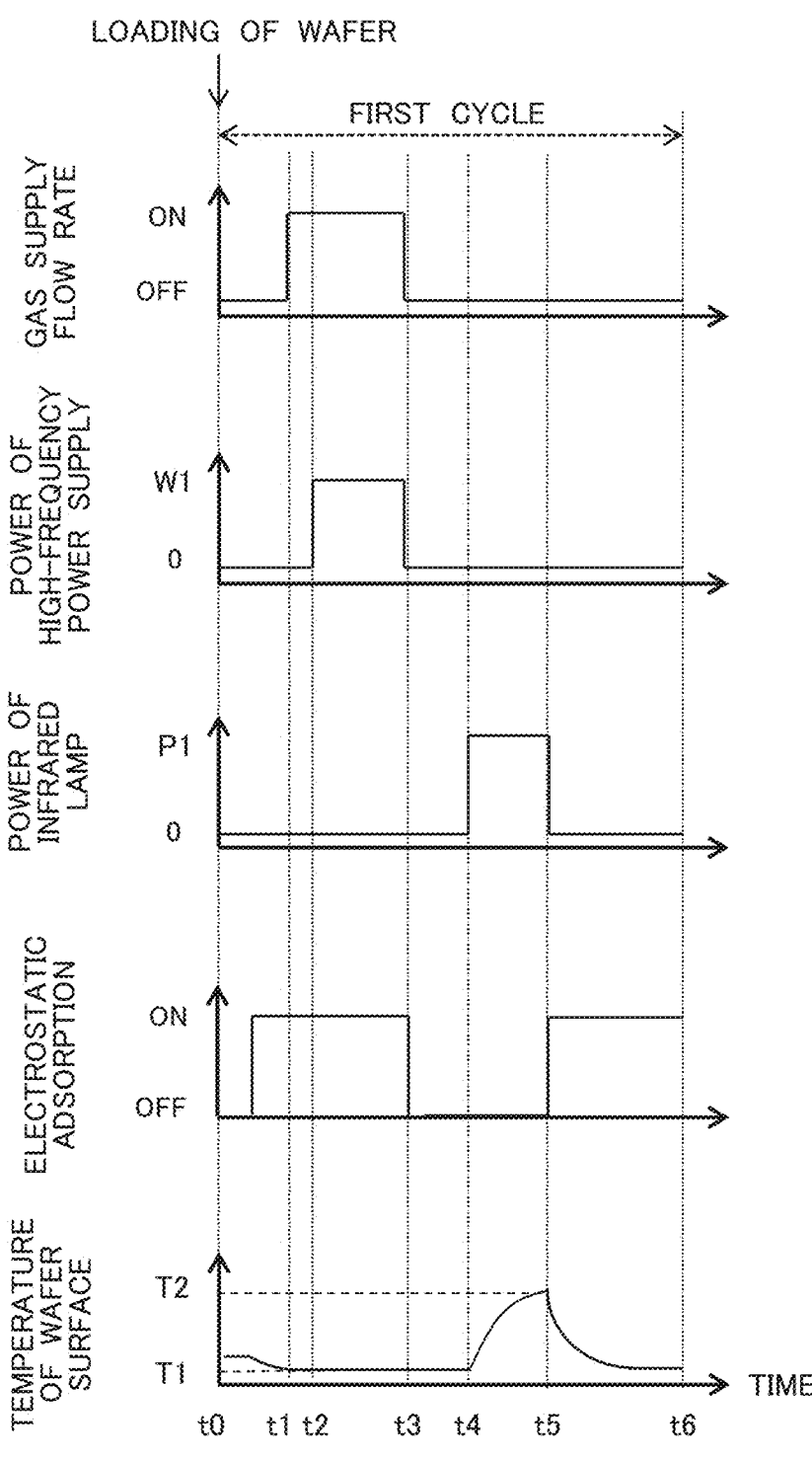
FIG. 3 is a time chart showing changes over time of a plurality of parameters included in the treatment conditions during wafer treatment according to the example illustrated in FIG. 1.
Figure 4:
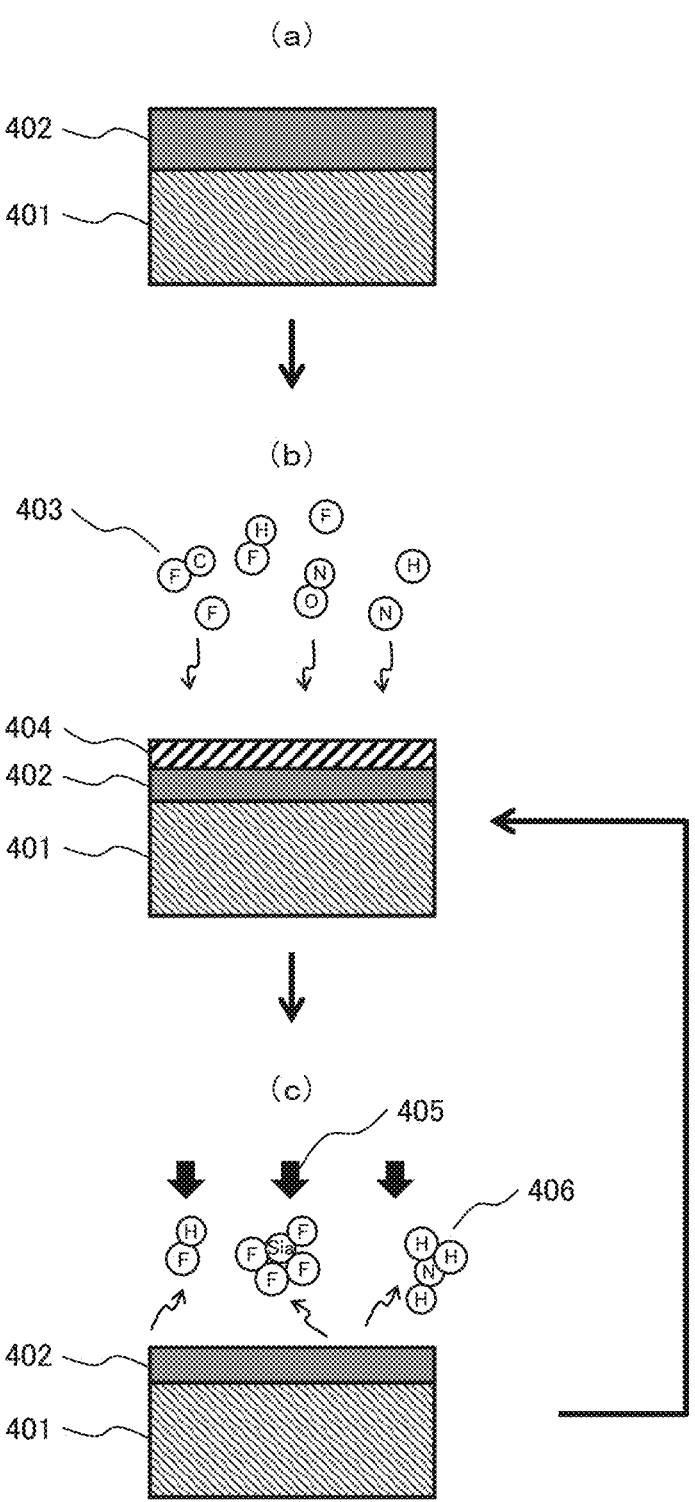
FIG. 4 illustrates schematic cross-section views of the overview of changes in film structure including a SiGe containing film during wafer treatment according to the example illustrated in FIG. 3.

The following description with reference to FIGS. 3 and 4 is the order of operation where the plasma treatment apparatus 100 according to the example is used to etch a film layer including an SiGe film on the wafer 2 using $CHF_3$/$O_2$/$N_2$ as a gas for reaction layer formation. FIG. 3 is a time chart showing changes over time of a plurality of parameters included in the treatment conditions during wafer treatment according to an example illustrated in FIG. 1. The parameters illustrated in FIG. 3 are, in order from top to bottom, a gas supply flow rate, power of high-frequency power supply, power of infrared lamp, electrostatic adsorption, and wafer surface temperature.

FIG. 4 illustrates schematic cross-section views of the overview of changes in film structure including a film layer including an SiGe film during wafer treatment according to the example illustrated in FIG. 3. In particular, FIG. 4 schematically illustrates the structure and changes thereof around the surface of the SiGe film 402 of a film structure in which the SiGe film 402 is stacked on and located in contact with the underlying film 401 of the wafer 2.

Initially, at time to in the treatment illustrated in FIG. 3, in response to an instruction signal from the control section 40, the wafer 2 with a pre-formed film structure having the underlying film 401 and the SiGe film 402 as a film layer to be subjected to etching treatment as illustrated in FIG. 4 (a) is carried into the treatment chamber 1 through a delivery port (not shown) installed in the treatment chamber 1 and then is loaded on the stage 4. Then, the power is supplied from the DC power supply 31 to the electrostatic adsorption electrode 30 so that the wafer 2 is electrostatically adsorbed and held on the dielectric film on the stage 4. Further, in response to an instruction signal from the control section 40, the flow rate of a wafer cooling He gas is adjusted and supplied into a gap between the stage 4 and the underside of the wafer 2 by the mass flow controller 50-4 assigned He gas in the mass flow controller control section 51, and the pressure of the He gas in the gap is adjusted to a value within a predetermined range. As a result, thermal transfer between the stage 4 and the wafer 2 is accelerated, so that the temperature of the wafer 2 becomes a value T1 close to the temperature of the stage 4 by supplying and circulating, to and through the coolant passage 39, the coolant which has been pre-changed to a predetermined temperature by the chiller 38.

Subsequently, at time t1 illustrated in FIG. 3, in response to an instruction signal from the control section 40, the flow rate to be supplied is adjusted by each of the $CHF_3$ mass flow controller 50-3, the $O_2$ mass flow controller 50-2, and the $N_2$ mass flow controller 50-1 of the mass flow controller 50, and a gas mixture produced by mixing the gases of a plurality of species of substances is suppled as treatment gas at a flow rate within a predetermined range into the treatment chamber 1. Along with this, the degree of opening of the pressure adjustment unit 14 is adjusted so that the pressure in the discharge region 3 within the quartz chamber 12 and within the treatment chamber 1 takes a value within an intended range.

In this state, at time t2 illustrated in FIG. 3, in response to an instruction signal from the control section 40, a high-frequency power of a predetermined value W is supplied from the high-frequency power supply 20 to the ICP coil 34, so that plasma discharge is initiated within the discharge region 3 within the quartz chamber 12 to generate a plasma 10 within the quartz chamber 12. On this occasion, no power is supplied to the infrared lamp 62 because during the generation of the plasma 10, the temperature of the wafer 2 is maintained the same as before the plasma 10 is generated.

In this state, at least some of the $CHF_3/O_2/N_2$ gas particles are excited, dissociated, or ionized by the plasma 10 to form charged particles such as ions or reactive particles such as an active species. The reactive particles such as an active species and neutral gas formed in the discharge region 3 pass through the slits or the through holes formed in the slit plate 78 to be introduced into the treatment chamber 1 and supplied onto the surface of the wafer 2. As illustrated in FIG. 4(b), the active species 403 including fluorocarbon radical ($CF_x$), HF, and/or the like adsorb onto the surface of the SiGe film 402 of the wafer 2 and interacts with the materials of the SiGe film 402 to from a surface reaction layer 404. Stated another way, reactive particles 403 including fluorine, hydrogen, and nitrogen are supplied to the surface of the film layer of the SiGe film 402 to form the surface reaction layer 404 on the surface of the film layer of the SiGe film 402.

Figure 5:
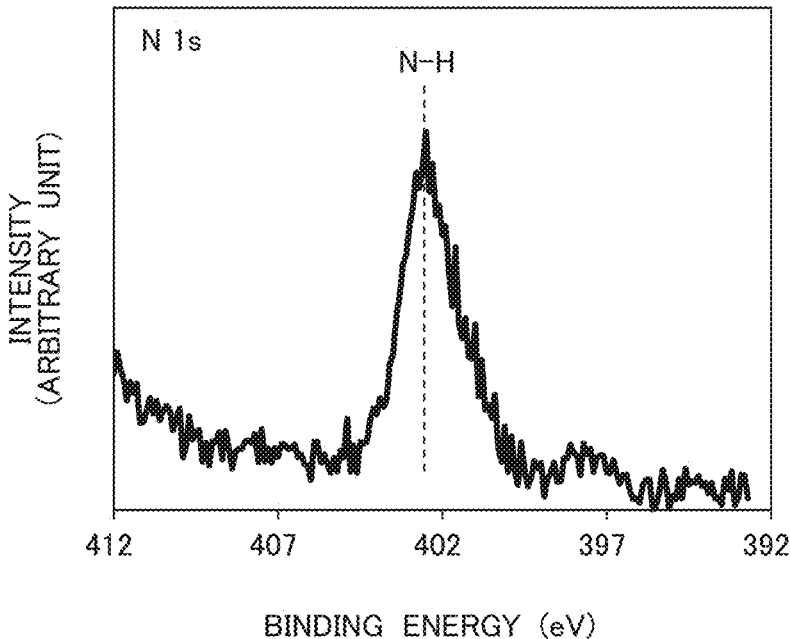
FIG. 5 is a graph illustrating the analysis results of the wafer surface according to the example illustrated in FIG. 1.

The surface reaction layer 404 is a reaction product containing at least N—H bond as a major constituent, which has a noticeable feature that, in the measurement by x-ray photoelectron spectroscopy using an aluminum $K_\alpha$ line, the bond energy of nitrogen 1 s spectrum has a peak at about 402±2 eV. The reaction layer also includes Ge—F bond and/or Si—F bond, and is characterized by including ammonium salt indicated by chemical composition such as $(NH_4)_xSiF_y$ and $(NH_4)_xGeF_y$. FIG. 5 is a photoelectron spectrum when the surface of the SiGe film 402 with the surface reaction layer 404 formed thereon is analyzed by the x-ray photoelectron spectroscopy using an aluminum $K_\alpha$ line. A peak arising from the surface reaction layer 404, which indicates the existence of N—H bond is observed around the bond energy 402±2 eV. The composition of the surface reaction layer 404 depends on composition of used gas and/or reaction time, and either may be in a mixed state of various bonding states of hydrogen, nitrogen, fluorine, and SiGe such as single-element hydrogen, single-element fluorine, $NH_3$, and ammonium salt, or may include oxygen arising from added oxygen gas and/or the like. It is noted that the value of the bond energy described herein is a calibrated value on the assumption that the position of the carbon 1s peak arising from the surface contaminated carbon observed on the surface of an initial sample is 284.5 eV.

Figure 6:
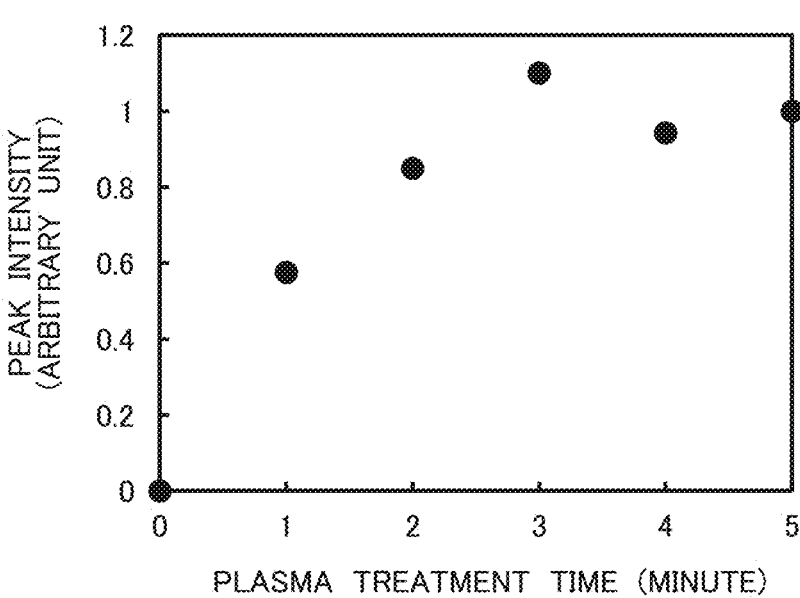
FIG. 6 is a graph illustrating the plasma treatment time dependence of the surface reaction layer formation rate according to the example illustrated in FIG. 1.

FIG. 6 is a graph illustrating the plasma treatment time dependence of the peak intensity of bond energy 402±2 eV arising from the surface reaction layer 404. The plasma treatment time indicates the amount of time elapsed from the start of supplying the high-frequency power. As illustrated in FIG. 6, the peak intensity of the bond energy 402±2 eV arising from the surface reaction layer 404 increases with the passage of the plasma treatment time to show a tendency toward saturation, and then becomes approximately constant upon a lapse of three minutes or longer of the plasma treatment time. In this manner, the property of the formation rate of the reaction products having self-saturation resembles a natural oxidation phenomenon of a metal surface or a silicon surface. In this manner, since there is self-saturation in the formation of the surface reaction layer 404, a constant amount of the surface reaction layer 404 generated per cycle can be achieved by performing the plasma treatment for more time than the time required for saturation. It has also been confirmed that etching of the SiGe layer does not progress during the plasma exposure. This is because the reaction layer generated on the surface has the property of inhibiting the progress of etching. In this manner, because of no progress of etching during the plasma exposure, the amount of etching relies on the formation rate of the surface reaction layer 404 having the self-limiting nature in terms of the plasma treatment time. Therefore, as long as the time of the plasma treatment is equal to or exceeds the time required for saturation, the amount of etching is determined by the number of cycles absolutely irrespective of the plasma treatment time. It is noted that, in the experiment conditions illustrated in the example, three minutes are required until the formation rate of the surface reaction layer 404 is saturated, but the time required to saturation varies depending on apparatus parameters such as a distance between the plasma source (12, 34) and the wafer 2 and a substrate temperature. For example, decreasing the distance between the plasma source and the wafer 2 allows a reduction in time required to saturation.

After a lapse of the plasma treatment time required for saturation of the generation of the surface reaction layer 404, at time t3 illustrated in FIG. 3, in response to an instruction signal from the control section 40, the output of the high-frequency power from the high-frequency power supply 20 is stopped and also the supply of treatment gas to the discharge region 3 is stopped. Because of this, the plasma 10 is lost within the discharge region 3. Also, during from time t3 to time t4, the particles of the treatment gas, the reactive particles, and/or the like within the treatment chamber 1 are evacuated to the outside of the treatment chamber 1 through the evacuation unit 15 and the vacuum evacuation piping 16 adjusted in the degree of opening by the pressure adjustment unit 14.

At time t4, in response to an instruction signal from the control section 40, the infrared lamp 62 is turned on so that the surface of the wafer 2 is vacuum heated by the light (infrared light) 405 emitted from the infrared lamp 62 as illustrated in FIG. 4(*c*). The illumination time of the infrared lamp is, for example, 15 seconds. A suitable maximum temperature reached of the surface of the wafer 2 ranges from 50° C. to 300° C. The step is a reaction where the surface reaction layer 404 is decomposed into the reaction products 406 such as silicon tetrafluoride, germanium tetrafluoride, ammonia, and hydrogen fluoride, for volatilization or desorption. The higher the temperature and the lower the pressure, the faster the desorption reaction progresses. The inventors have found that, for initiating the desorption reaction, a required temperature of the surface of the wafer 2 is 50° C. or higher and also a preferable pressure in the treatment chamber 1 is 100 Pa or lower.

Figure 7:
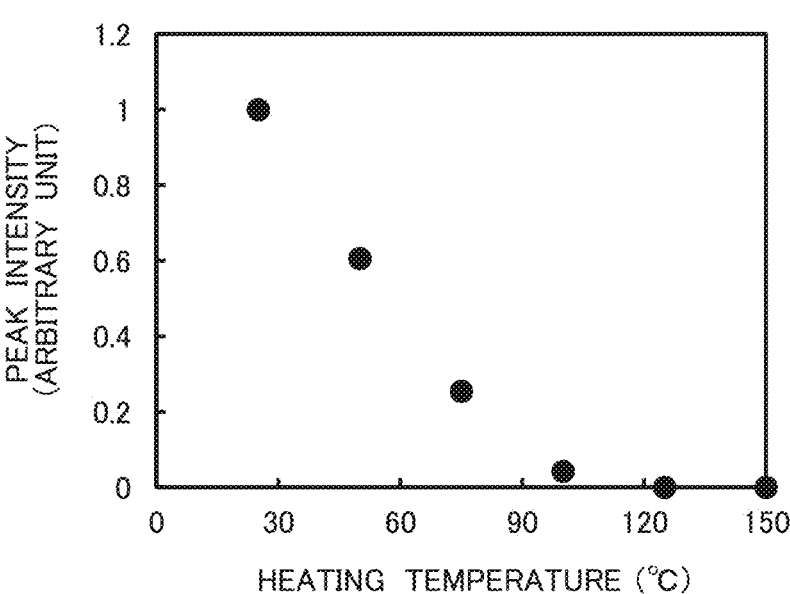
FIG. 7 is a graph illustrating the heating temperature dependence of the residual amount of the surface reaction layer according to the example illustrated in FIG. 1.

FIG. 7 shows a plot of changes of the residual amount of the surface reaction layer 404 with the peak intensity of the bond energy 402±2 eV immediately after irradiation being assumed as one, in the case where the surface reaction layer 404 is generated at low temperatures and then isochronal annealing is performed while the temperature is changed to 25° C., 50° C., 75° C., 100° C., 125° C. and then to 150° C. As a result, it is seen that the surface reaction layer 404 shows no change in intensity under annealing treatment at 25° C., but a reduction in intensity is started upon heating to 50° C. or higher. From this, it has been found that a heating temperature suitable for removing the surface reaction layer 404 is 50° C. or higher.

Also, the time required for lamp heating is typically from 10 seconds to 30 seconds, but the heating time more varies according to the power of the lamp 62, a distance between the lamp 62 and the wafer 2, and/or the like. In the heating step, only the surface reaction layer 404 generated on the surface of the wafer 2 is decomposed and volatilized and only the surface layer 404 portion may be removed since no change occurs in the unreacted SiGe film 402 present at the bottom of the surface reaction layer 404. Specifically, the removal rate of the surface reaction layer 404 is independent of the lamp heating time as long as the lamp heating time has a sufficient length corresponding to the time required for removing the surface reaction layer 404 or longer. Therefore, in addition to the step of forming the surface reaction layer 404, the step of removing the surface reaction layer

404 also has self-limiting nature in a sense that the removal rate is independent of the lamp heating time. In this way, in the atomic layer etching of the SiGe film according to the present invention, as long as the plasma exposure time and the lamp heating time are each sufficiently ensured by exceeding the time required for saturation, the amount of etching is determined depending on the number of cycles of plasma exposure and lamp heating without relying on the plasma exposure time and the lamp heating time. Therefore, the amount of etching becomes constant irrespective of the in-plane of the wafer 2 and the depth of pattern.

It is noted that, for the heating step, while the wafer 2 is loaded on the wafer stage 4, the supply of helium gas used for increasing the thermal transfer to the underside of the wafer 2 is stopped to increase the temperature of the surface of the wafer 2 rapidly. It is noted that, in the embodiment, the wafer 2 is treated while the wafer 2 is loaded on the wafer stage 4, but the wafer 2 may be irradiated with the infrared light while the wafer 2 is out of thermal contact with the wafer stage 4 by use of a lift pin (not shown) or the like. After a lapse of the heating time required for removing the surface reaction layer 404, the infrared lamp 62 is turned off, and the residual gas in the treatment chamber 1 is evacuated to the outside of the treatment chamber 1 using the evacuation unit 15. After that, the supply of helium gas is restarted to increase the thermal transfer between the wafer 2 and the wafer stage 4 so that the temperature of the wafer 2 is cooled to a predetermined temperature ranging from −40° C. to 40° C. by the chiller 38, thus terminating the treatment in a first cycle.

In response to an instruction signal from the control section 40, at time t5 illustrated in FIG. 3, the infrared lamp 62 is turned off. Also, the gas including reaction product particles and/or the like within the treatment chamber 1 is evacuated to the outside of the treatment chamber 1 via the evacuation unit 15 and the vacuum evacuation piping 16 adjusted in the degree of opening by the pressure adjustment unit 14. Further, from time t5 onward, as described in FIG. 2, it is determined whether or not the amount of etching of the SiGe film 402 on the wafer 2 or the thickness of residual film has reached a predetermined value (corresponding to step S207). Then, depending on the determination result, the step of starting the next cycle (S201 to S206) or terminating the treatment of the wafer 2 is performed.

For starting the next cycle, at arbitrary time t6 after time t5, in response to an instruction signal from the control section 40, the introduction of a CHF$_3$/O$_2$/N$_2$ gas into the discharge region 3 is started as in the case of the operation beginning at time t1. Specifically, in the next cycle, the step of forming the surface reaction layer 404 described in FIG. 4(*b*) and the step of desorbing the surface reaction layer by means of heating described in FIG. 4(*c*) are performed again. For terminating the treatment of the wafer 2, the supply of the He gas supplied into the gap between the underside of the wafer 2 and the top surface of the stage 4 is stopped at time t6, and also the valve 52 is opened to remove the He gas through the gap so that the pressure in the gap reaches comparable with the pressure in the treatment chamber 1, and so that the step is performed for releasing the electrostatic adsorption of the wafer 2 including removal of static electricity. Thus, the step of etching the SiGe film 402 is terminated.

Figure 8:
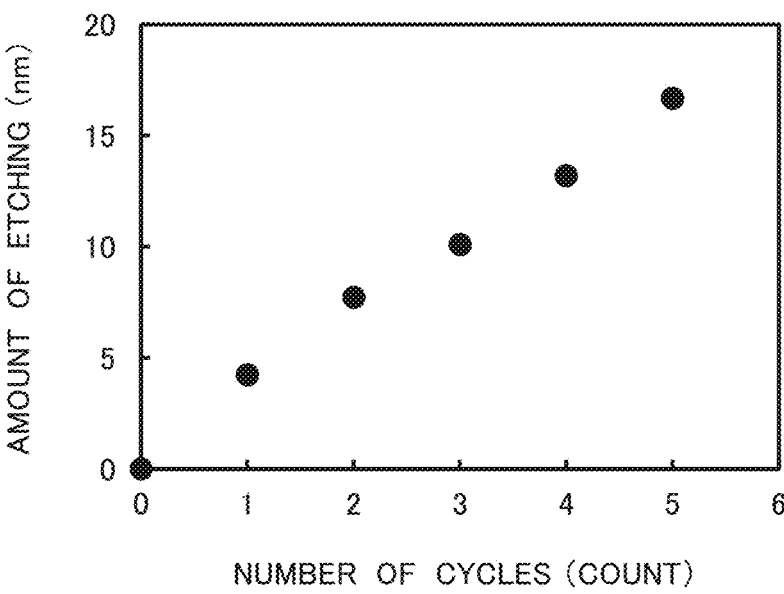
FIG. 8 is a graph illustrating the relationship between the number of cycles and the amount of etching in the etching treatment performed by the plasma treatment apparatus according to the example illustrated in FIG. 1.

In the example, if the amount of etching requires 10 nm, the above-described cycle is repeated three times to terminate the etching. FIG. 8 is a graph illustrating the relationship between the number of cycles and the amount of etching in the etching treatment performed by the plasma treatment apparatus 100 according to the example illustrated in FIG. 1. In FIG. 8, the horizontal axis indicates the number of cycles and the vertical axis indicates the amount of etching (etch depth) detected using In-Situ Ellipsometry (polarization analysis) after the completion of each performed cycle and prior to the start of a next cycle.

As illustrated in FIG. 8, in the example, the amount of etching varies approximately linearly with an increase in the number of cycles. It has been shown from FIG. 8 that the etching rate of the SiGe film per cycle in the example is, for example, 3.3 nm/cycle.

As described above, the first step of forming the surface reaction layer 404 and the second step of removing the surface reaction layer 404 in the example both have the property of terminating in a self-saturation fashion. From this, in the example, where the wafer 2 on which a film structure with circuit pattern is pre-formed is etched, the amount of etching of the surface of the SiGe film 402 at the completion of a single cycle may be made more uniform because of reduced variations in the depth direction and the in-plane direction of the wafer 2.

By use of the above-described self-saturation, even if the density of the reactive particles suppled to the wafer 2 has a different distribution depending on a position in the depth direction or the horizontal direction of the top surface of the wafer 2, the amount of etching is prevented from increasing more than necessary or becoming insufficient, so that the variations in the amount of etching is reduced. Also, the entire amount of etching may be adjusted by increasing and decreasing the number of repetitions of a cycle including the first and second steps, and the amount of etching in the example corresponds to the multiples or the sum of the number of times of the etching rate per cycle. As a result, in the example, as compared with the conventional etching by the continuous plasma treatment, the controllability on dimensions after the step using the etching treatment and also the treatment yields may be improved.

According to the above example, an isotropic atomic layer etching technology may be provided in which the SiGe film is processed with high uniformity in the wafer in-plane direction and/or the pattern depth direction. It is noted that, since the amount of etching of the siGe film is larger than the amount of etching of the Ge film, the present invention is suitable for etching of the SiGe film selective to the Ge film. On the other hand, the amount of etching of the Ge film varies depending on apparatus parameters such as species of a gas mixture, a mixture ratio, and a stage temperature. In the application required by the atomic layer etching of Ge, the technology of the present invention in which the surface reaction layer characterized by including N—H bond is formed on the Ge surface can be applied as the atomic layer etching of the Ge film.

It is noted that in the plasma treatment apparatus 100 in FIG. 1, the infrared lamp 62 is placed outside the vacuum container above the treatment chamber 1 and on the perimeter of the quartz chamber 12 surrounding the discharge region 3, but the infrared lamp 62 may be placed inside the vacuum container or the quarts chamber 12. Further, the above-described examples have been described in detail for the purpose of providing an intelligible description of the present invention, and the present invention is not necessarily limited to ones including all the configurations described herein.

REFERENCE SIGNS LIST

1 . . . treatment chamber,
2 . . . wafer,
3 . . . discharge region,
4 . . . stage,
5 . . . shower plate,
6 . . . top panel,
10 . . . plasma,
11 . . . base chamber,
12 . . . quartz chamber,
14 . . . pressure adjustment unit,
15 . . . evacuation unit,
16 . . . vacuum evacuation piping,
17 . . . gas dispersion plate,
20 . . . high-frequency power supply,
22 . . . matching box,
25 . . . high-frequency cut off filter,
30 . . . electrostatic adsorption electrode,
31 . . . DC power supply,
34 . . . ICP coil,
38 . . . chiller,
39 . . . coolant passage,
40 . . . control section,
41 . . . computing section,
50 . . . mass flow controller,
51 . . . mass flow controller control section,
52 . . . valve,
60 . . . container,
62 . . . infrared lamp,
63 . . . reflector,
64 . . . infrared lamp power supply,
70 . . . thermocouple,
71 . . . thermocouple thermometer,
74 . . . light transmission window,
75 . . . gas passage,
78 . . . slit plate,
81 . . . O ring,
92 . . . optical fiber,
93 . . . external infrared light source,
94 . . . light path switch,
95 . . . optical splitter,
96 . . . spectroscope,
97 . . . detector,
98 . . . optical multiplexer,
100 . . . plasma treatment apparatus,
401 . . . underlying film,
402 . . . SiGe film,
403 . . . active species,
404 . . . surface reaction layer,
406 . . . reaction product,
901 . . . underlying structure,
902 . . . Ge channel layer,
903 . . . SiGe sacrificial layer,
904 . . . mask,
905 . . . reaction layer including mainly oxides,
906 . . . reaction layer including mainly ammonium salt.

The invention claimed is:

1. An etching method for etching a film layer to be treated including a layer of SiGe and a layer of Ge placed on a surface of a wafer, comprising:

a step of forming a reaction layer containing nitrogen-hydrogen bond on a surface of the layer of SiGe by using a plasma of a gas mixture including at least fluorine, hydrogen, and nitrogen to supply reactive particles to the surface of the layer of SiGe exposed to and etched by the plasma; and a step of heating the film layer to desorb the reaction layer, wherein the gas mixture includes at least fluorine, hydrogen, nitrogen, and oxygen.

2. The etching method according to claim 1, wherein the reaction layer containing nitrogen-hydrogen bond includes ammonium salt.

3. The etching method according to claim 2, wherein the reaction layer has self-limiting nature in terms of a treatment time of the step of forming the reaction layer and a treatment time of the step of desorbing the reaction layer.

4. The etching method according to claim 2, wherein a sequence of a plurality of steps including the step of forming the reaction layer and the step of desorbing the reaction layer is considered as a cycle, and the cycle is repeated two or more times.

5. The etching method according to claim 1, wherein the reaction layer has self-limiting nature in terms of a treatment time of the step of forming the reaction layer and a treatment time of the step of desorbing the reaction layer.

6. The etching method according to claim 5, wherein a sequence of a plurality of steps including the step of forming the reaction layer and the step of desorbing the reaction layer is considered as a cycle, and the cycle is repeated two or more times.

7. The etching method according to claim 1, wherein a sequence of a plurality of steps including the step of forming the reaction layer and the step of desorbing the reaction layer is considered as a cycle, and the cycle is repeated two or more times.

8. The etching method according to claim 1, wherein the film layer includes a predetermined multi-layer film that is formed by alternately stacking a Ge layer and a SiGe layer, and the Ge layer forms a GAA FET channel layer.

\* \* \* \* \*